United States Patent
Woods et al.

(10) Patent No.: US 7,782,156 B2
(45) Date of Patent: Aug. 24, 2010

(54) LOW-LOSS INTERFACE

(75) Inventors: Charles Woods, Gilbert, AZ (US); Noel Lopez, Phoenix, AZ (US); Dean Cook, Mesa, AZ (US); Jon Filreis, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 11/853,287

(22) Filed: Sep. 11, 2007

(65) Prior Publication Data

US 2009/0066441 A1   Mar. 12, 2009

(51) Int. Cl.
*H03H 7/38* (2006.01)
*H01P 5/08* (2006.01)

(52) U.S. Cl. .......................................... 333/34; 333/254
(58) Field of Classification Search .................... 333/34, 333/33, 254, 260, 26
See application file for complete search history.

(56) References Cited

U.S. PATENT DOCUMENTS

| | | | |
|---|---|---|---|
| 3,109,054 A | 10/1963 | Kuhnapfel | |
| 3,987,451 A | 10/1976 | Peterson | |
| 4,608,713 A | 8/1986 | Shiomi et al. | |
| 4,678,868 A | 7/1987 | Kraska | |
| 4,868,639 A | 9/1989 | Mugiya et al. | |
| 4,947,111 A | 8/1990 | Higman | |
| 4,967,168 A | 10/1990 | Bacher et al. | |
| 5,019,829 A | 5/1991 | Heckman | |
| 5,045,820 A | 9/1991 | Leicht et al. | |
| 5,198,786 A | 3/1993 | Russell et al. | |
| 5,218,373 A | 6/1993 | Heckaman et al. | |
| 5,223,672 A | 6/1993 | Pinneo | |
| 5,376,901 A | 12/1994 | Chan | |
| 5,488,380 A * | 1/1996 | Harvey et al. | ................ 342/368 |
| 5,678,210 A | 10/1997 | Hanna | |
| 5,945,894 A | 8/1999 | Ishikawa et al. | |
| 5,969,580 A | 10/1999 | Maillet et al. | |
| 6,232,849 B1 | 5/2001 | Flynn et al. | |
| 6,265,580 B1 | 7/2001 | Matsuda | |
| 6,265,950 B1 * | 7/2001 | Schmidt et al. | ................ 333/26 |
| 6,363,605 B1 | 4/2002 | Shih et al. | |
| 6,803,837 B2 | 10/2004 | Ishida | |
| 6,911,877 B2 | 6/2005 | Bickford | |
| 7,068,121 B2 | 6/2006 | Ding | |

(Continued)

FOREIGN PATENT DOCUMENTS

EP   1367668   12/2003

(Continued)

OTHER PUBLICATIONS

Office Action dated Jan. 5, 2009 for U.S. Appl. No. 11/874,369.

(Continued)

*Primary Examiner*—Stephen E Jones
(74) *Attorney, Agent, or Firm*—Snell & Wilmer L.L.P.

(57) ABSTRACT

In general, in accordance with an exemplary aspect of the present invention, a low-loss interface for connecting an integrated circuit such as a monolithic microwave integrated circuit to an energy transmission device such as a waveguide is disclosed. In one exemplary embodiment, the interface comprises a pin attached to a matching network that matches the impedance of the energy produced at the circuit to the impedance required by the waveguide without the use of a dielectric material.

28 Claims, 6 Drawing Sheets

U.S. PATENT DOCUMENTS

| | | |
|---|---|---|
| 7,486,157 B2 | 2/2009 | Takagi |
| 2007/0096805 A1 | 5/2007 | Kim et al. |

FOREIGN PATENT DOCUMENTS

| | | |
|---|---|---|
| JP | 1998-289767 | 10/1998 |
| JP | 2001-177311 | 6/2001 |
| KR | 2000-0004040 | 2/2000 |
| KR | 2001-0091539 | 10/2000 |
| WO | PCT0300597 | 3/2003 |
| WO | WO03092115 | 11/2003 |
| WO | PCTUS2008062095 | 4/2008 |

OTHER PUBLICATIONS

First Written Opinion of International PCT Application No. PCT/US2008/075969 dated Nov. 18, 2008.
Final Office Action dated Jun. 19, 2009 in U.S. Appl. No. 11/874,369.
Nonfinal Office Action dated Dec. 12, 2008 for U.S. Appl. No. 11/743,496.
Nonfinal Office Action dated Nov. 18, 2009 for U.S. Appl. No. 11/874,369.
Final Office Action dated Jun. 19, 2009 for U.S. Appl. No. 11/874,369.
Nonfinal Office Action dated Jan. 5, 2009 for U.S. Appl. No. 11/874,369.
Nonfinal Office Action dated Nov. 27, 2009 for U.S. Appl. No. 12/039,529.
Notice of Allowance dated Oct. 1, 2009 for U.S. Appl. No. 11/743,496.
Notice of Allowance dated Apr. 6, 2009 for U.S. Appl. No. 11/743,496.
International Preliminary Report on Patentability dated May 20, 2009 for International Patent Application No. PCT/US2008/062095.
International Preliminary Report on Patentability dated Mar. 16, 2010 for International Patent Application No. PCT/US2008/075969.
First Written Opinion dated Oct. 12, 2009 for International Patent Application No. PCT/US2009/037023.
Nonfinal Office Action dated Apr. 16, 2010 for U.S. Appl. No. 11/874,369.
Final Office Action dated Apr. 19, 2010 for U.S. Appl. No. 12/039,529.

* cited by examiner

LOW-LOSS INTERFACE

FIELD OF INVENTION

The present invention generally relates to an interface for use, for example, between an integrated circuit and a waveguide. More particularly, the present invention relates to an interface comprising an impedance circuit such as a step launch that transports or transforms energy from, an integrated circuit, such as a monolithic microwave integrated circuit, to a waveguide without the use of a dielectric material.

BACKGROUND OF THE INVENTION

There are numerous circuits and other electronic devices that produce energy waves, such as electromagnetic waves and microwaves. These circuits produce energy waves that are delivered to a destination through different wires, guides, and other mediums.

Transitioning microwave signals from one mode to another or interfacing to another medium is "lossy." The signal/energy is lost to radiation, metal losses, dielectric losses, and mismatch losses. By being lossy, a portion of the signal is lost as it travels through the circuits, wires, and other mediums. Stated another way, a signal entering a lossy material will be greater at the point of entry than at the point of exit.

Transitions at microwave frequencies are particularly difficult and lossy. Dielectric materials have higher loss tangents at microwave frequencies versus lower frequencies. At microwave frequencies metal losses become greater due to reduced skin depth and increased sensitivity to surface roughness. Apart from materials being lossier at microwave frequencies, the design of the transitions and interfaces is more difficult. It is difficult to control or predict phase at microwave frequencies. This leads to greater mismatch losses. Typically, the simpler an interface is, the less loss it will experience. One exemplary circuit that generates and transports microwaves is a "monolithic microwave integrated circuit" or "MMIC." Lost signal waves are unusable and decrease the efficiency of a MMIC as the signal strength decreases due to loss. Generally, the higher the frequency of the microwave, the more lossy the transmission medium and more inefficient the circuit. In certain applications, even signal losses that reduce the signal small amounts, such as 1/10 of a decibel, may result in a significant performance loss. One exemplary application where loss from energy waves such as microwaves is problematic is a power amplifier.

One structure used to reduce lossiness is a waveguide. Waveguides are structures that guide energy waves with minimal signal loss. Unfortunately, signal loss is still problematic with certain waves because the connection or interface between the circuit generating the energy waves and the waveguide can be lossy itself. This is especially an obstacle with MMIC generated microwaves. Moreover, impedance miss-matches also cause signal losses. For example, the impedance of the MMIC, for example fifty ohms, may not match the impedance of the connected waveguide, which is much higher, typically several hundred ohms higher than the impendence of the MMIC. Moreover, the MMIC and waveguide also likely have a different modes of energy wave propagation. These types of interfaces are known generally as "impedance matching interfaces" or "impedance matching and transforming interfaces" and these interfaces transform impedance and wave mode propagation of the energy traveling through the interface. Throughout, the term "interface" is meant to denote an "impedance matching interface" or "impedance matching and transforming interface."

Current interfaces between a MMIC and waveguide comprise numerous structures that include wirebonds, microstrips, pins, and other devices to connect a circuit to a waveguide or another structure. Each part of a matching network as associated loss. These interfaces also attempt to match and transform the impedance of the MMIC to the impedance at the waveguide. However, current impendence matching interfaces between an integrated circuit such as a MMIC and a waveguide still have an unacceptable amount of loss.

Current interfaces also use dielectrics to match impedance. While effective, interfaces that require dielectric materials are more expensive to produce and require a greater number or parts or materials as a dielectric must be included. Use of a dielectric also reduces the interface's efficiency as the dielectric also has an associated loss.

Therefore, it would be advantageous to provide an interface between an integrated circuit, such as a MMIC, and a waveguide, or other structure that reduces signal loss. It would also be advantageous to produce an interface that reduced loss that was inexpensive and easy to manufacture, particularly one that was constructed from parts that were commercially available and did not require the use of dielectric materials or microstrips.

SUMMARY OF THE INVENTION

In general, in accordance with one exemplary aspect of the present invention, an interface for connecting two devices that transmit energy is provided. In one exemplary embodiment, the interface of the present invention is a low-loss interface that directly connects a MMIC to a waveguide without the use of dielectric materials. Further, according to one exemplary embodiment, the interface comprises a step launch that is configured to match the impedance of the waveguide. In yet another aspect of one exemplary embodiment, the step launch is configured to gradually transition a relatively narrow opening to the size of the opening in the waveguide. In yet another aspect of one exemplary embodiment, the interface is connected to a tension absorbing pin that is configured to connect the MMIC to the interface.

BRIEF DESCRIPTION OF THE DRAWING

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

In accordance with one aspect of the present invention, an interface for connecting an integrated circuit to an energy transmission device such as a waveguide is disclosed. Throughout, the interface will be referred to as interface 10.

Figure 1:
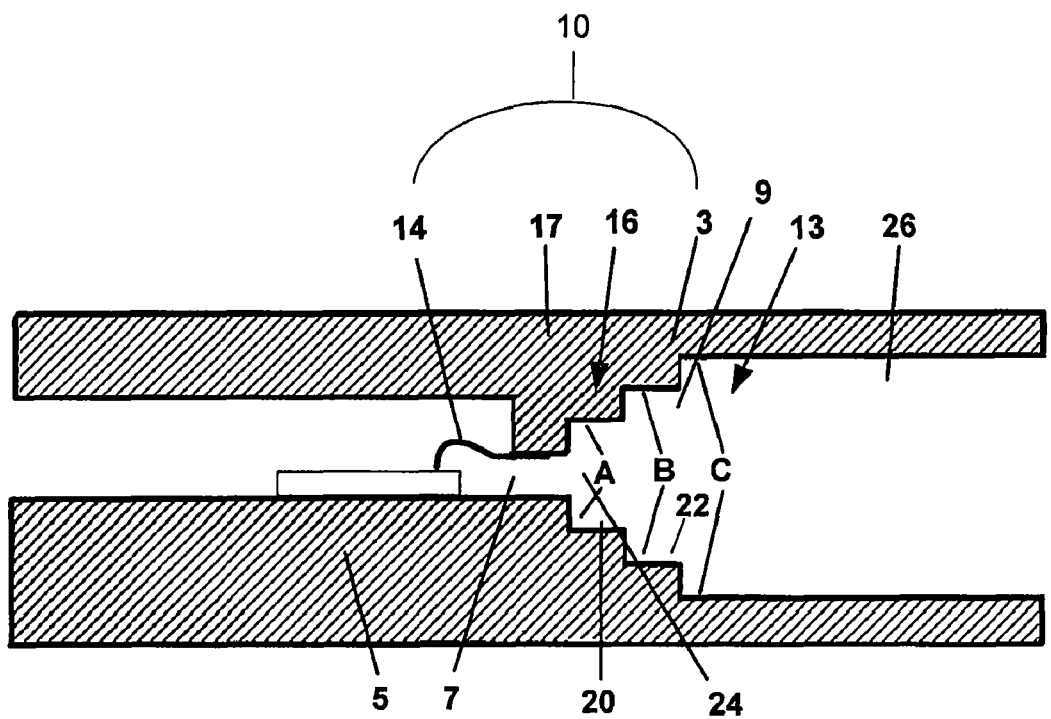
FIG. 1 illustrates an exemplary drawing of the interface connecting a MMIC to a waveguide in accordance with an exemplary embodiment of the present invention.
Figure 2:
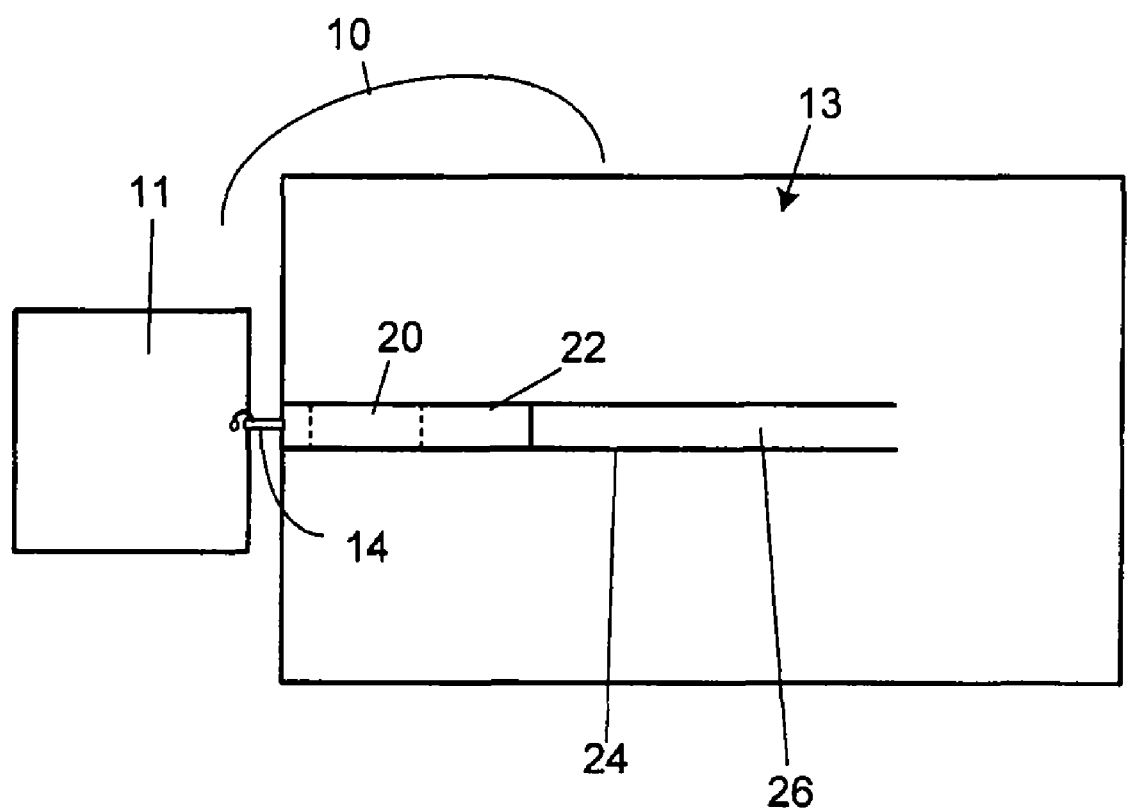
FIG. 2 illustrates an exemplary drawing depicting the top view of the interface connecting a MMIC to a waveguide as shown in FIG. 1 in accordance with an exemplary embodiment of the present invention.

With reference to FIGS. 1-3, and in accordance with an exemplary embodiment of the present invention, an interface 10 is provided between an integrated circuit 11 and an energy transmission device 13. For example, interface 10 may be provided between a MMIC and a waveguide. Interface 10 is configured to be a low-loss interface and comprises a step launch 16 that directly connects circuit 11 to energy transmission device 13 without the use of dielectric materials. Interface 10 is configured to match the impedance and mode of energy wave propagation from circuit 11 to energy transmission device 13.

As shown in the exemplary embodiment depicted in FIG. 1, interface 10 may be formed from two pieces of energy transmission material such as a lid 3 and a package base 5 being connected together. In this exemplary embodiment, lid 3 and base 5 are formed in such a shape that when these two parts are properly aligned they form a cavity that comprises step launch 16 of interface 10 and that further comprises the energy transmission device 13. In an exemplary embodiment, the two housing portions are shaped such that when brought together they form a recess that is interface 10 and waveguide 13 and where interface 10 is a gradual transition to the waveguide cavity. In other embodiments, interface 10 forms an abrupt mechanical transition from circuit 11 to the waveguide cavity or other energy transmission device 13.

Thus, in one exemplary embodiment, interface 10 comprises a stepped transition starting with a relatively smaller cavity 7 and increasing in size up to the size of the waveguide cavity. Interface 10 thus has a smaller cavity 7 at a first end and a larger cavity 9 at an opposing end. In other exemplary embodiments, another type of transition is used that non-stepped and abrupt instead of a gradual transition.

It should be noted that the term "low-loss" refers to the ability to minimize signal loss as discussed above. In an exemplary embodiment, interface 10 connects an integrated circuit 11 to energy transmission device 13 while matching the impedance and mode of energy wave propagation of energy transmission device 13 to prevent signal loss. Further, it should be noted that while reference herein is made to interface 10 matching the impedance and mode of energy wave propagation of energy transmission device 13 on the end 9 of interface 10 contacting energy transmission device 13, interface 10 also conversely matches the impedance and mode of energy wave propagation of circuit 11 on the end 7 of interface 10 connected to circuit 11.

In another exemplary embodiment, interface 10 connects any two devices that transmit and/or produce energy. Interface 10 can be used with transmitters, receivers, or transceivers. In this regard, interface 10 can connect two circuits 11 such as two MMICs, or it can connect two energy transmission devices 13 such as two waveguides. Furthermore, interface 10 can be any device configured to transmit energy and match impedance between two or more energy producing or transmission devices.

In one exemplary embodiment, circuit 11 is a monolithic microwave integrated circuit (MMIC). In another exemplary embodiment, circuit 11 comprises discrete components on a circuit board such as power amplifiers, low noise amplifiers, detectors, limiters, isolators, switches, filters, multiplexers, couplers, and the like. Circuit 11 can be any type of circuit, circuit board, printed circuit board, integrated circuit, discrete component, combination of discrete components, or other type of device or medium that produces, receives, or transfers microwave signals. As such, the term "circuit" is not limited to devices with discrete components on a circuit board but rather includes any device that passes energy waves such as wires, cables, or waveguides. Similarly, energy transmission device 13 can be any type of device or medium configured to transport energy. In one exemplary embodiment, energy transmission device 13 is a waveguide that transports microwave energy waves. In another exemplary embodiment, energy transmission device 13 comprises wires, cables or other devices configured to transport and guide energy waves from one source to another.

In one exemplary embodiment, step launch 16 is any device that has a relatively small cavity at end 7 near circuit 11 and a relatively larger cavity at end 9 near energy transmission device 13. Moreover, step launch 16 is configured to match the impedance of circuit 11 on one end and match the impedance of energy transmission device 13 on the opposing end by gradually adjusting the impedance from end 7 to end 9.

In one exemplary embodiment, step launch 16 is a stepped transition with a series of steps such as step A, step B, and step C that result in a cavity at end 7 that is smaller than the cavity at end 9. The cavity may be square, round, oval, or any other suitable shape, and the shape may or may not change from one end to the other. Moreover, the cavity may or may not be symmetrical. In various exemplary embodiments, step launch 16 comprises a smooth transition as opposed to a stair-step shape. For example, the transition from end 7 to end 9 may comprise a straight line, an exponential shape, and/or any other curve or function or combination of shapes.

In an exemplary embodiment, step launch 16 comprises a body 17 that defines a first ridge 20 and a second ridge 22 that form steps A and B collectively. Body 17 defines a space 24 that leads into cavity 26 defined by energy transmission device 13 such as a waveguide. In one exemplary embodiment, step launch 16 is configured such that the space between successive steps increases in the direction from end 7 to end 9. The depth and/or height of each step may be the same from step to step so that each step may resemble the step before it. In other embodiments, however, the depth and/or height of each step may vary compared to one or more other steps in the step launch.

Step launch 16 can be constructed from any conductive material that minimizes loss. In an exemplary embodiment, step launch 16 is gold plated. In other exemplary embodiments, step launch 16 is comprised of silver, copper, aluminum, plated plastics, plated ceramics, various metals and/or alloys, and/or other similar materials with low resistance. Any materials configured to facilitate impedance matching and reduce signal loss can be used to construct step launch 16.

In one exemplary embodiment, the step launch 16 comprises a single ridge step launch (e.g., steps A and B of the top side only). The step launch is configured to provide a stepped transition from the impedance of circuit 11 to the impedance of waveguide 13. In other exemplary embodiments, step launch 16 comprises a double ridge step launch (e.g., steps A, B, and C with a top and bottom) to accommodate waveguide cavities or other similar energy transmission devices with various sizes and impedance requirements. The number of ridge steps is typically related to the size of cavity 26 in that the larger cavity 26, the greater number of ridge steps may be used to match the output impedance of circuit 11 to cavity 26.

The number of ridges is a function of room available for transition and manufacturability of steps. Specifically, a smaller cavity may have less step features than a larger cavity. According to an exemplary embodiment of the present invention, any number of ridges, steps, or other similar features can be used and fall within the scope of the present invention. In yet other exemplary embodiments, step launch 16 can comprise a smooth, slopped transition without steps. The angle of the transition can be whatever angle needed to accommodate energy transmission device 13. Certain exemplary stepped transitions for various step launches 16 include, but are not limited to, triangular, exponential, or Klopfenstein tapers.

In accordance with an exemplary embodiment, interface 10 further comprises a pin 14 connected to a step launch 16. Pin 14 is generally a compressible, tension absorbing interface pin such as a spring configured to transmit energy. In an exemplary embodiment, pin 14 can be any shape and have any number of sides, including, but certainly not limited to, round, ovular, hexagonal, polygonal, square, rectangular, and triangular. Pin 14 may comprise an electrically conductive low-loss compressible material. Pin 14 may be formed from conductive material(s) which minimize energy loss. Certain exemplary materials include, but are not limited to, gold, silver, copper, various alloys, beryllium, copper, tungsten, and/or other similar materials with high conductivity and low resistance.

In an exemplary embodiment, pin 14 is formed from a single piece of conductive material. However, in other exemplary embodiments, pin 14 is formed from numerous pieces of conductive material that are joined together. The pieces of conductive material can be joined by soldering, welding, spot welding, brazed, epoxied, or mechanical connection points. The pieces of conductive material can be stacked if pin 14 is rectangular or square shaped or shaped in hemispheres if pin 14 is circular or oval. Moreover, individual strands of circular material can be used to form pin 14. Furthermore, any device or piece of material configured to transport energy can be used as pin 14.

In an exemplary embodiment, pin 14 is also configured to be compressible and flexible. This enables interface 10 to be used in applications that will result in movement of interface 10 through vibration, thermal expansion, or other causes. In that regard, pin 14 is capable of being compressed inward towards circuit 11 and stretched outward away from circuit 11 to allow interface 10 relative movement during use and not become disconnected from circuit 11 or energy transmission device 13.

Certain exemplary pins are 0.15 millimeters to fifty millimeters in length. Pin 14 can be any size suitable for the particular location that interface 10 is used for. For example, if a long distance is required between circuit 11 and the energy transmission device 13, pin 14 can be longer to accommodate that distance. Further, in certain other exemplary embodiments, pin 14 can be a probe, a coaxial pin, cable or another type of device with a coaxial configuration.

Figure 3A:
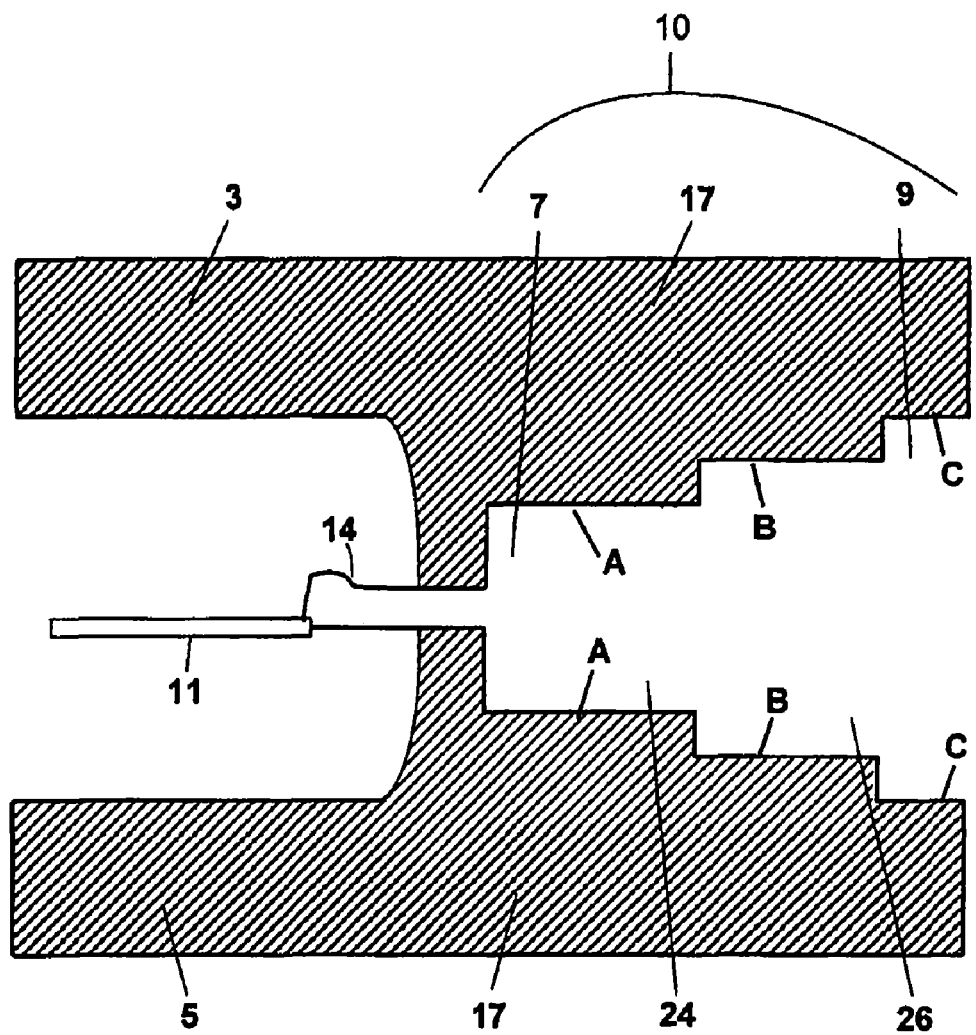
FIGS. 3A-3D illustrate various cutaway views of the interface and exemplary drawing of connection mechanisms for connecting an integrated circuit such as a MMIC to the interface in accordance with an exemplary embodiment of the present invention.

With reference to FIGS. 1 and 3A, and in accordance with an exemplary embodiment of the present invention, one end of pin 14 is attached to step launch 16. Furthermore, pin 14 may be attached to the step launch 16 on the underside of step launch 16, i.e. to lid 3. In another exemplary embodiment, the opposing end of pin 14 is configured to extend out over circuit 11 and contacts circuit 11 at a point of connection (such as a bond pad, an output pad or other similar device). In an exemplary embodiment, step launch 16 is a waveguide step launch and is sized to fit within or correspond to energy transmission device 13 such as a waveguide.

Figure 3B:
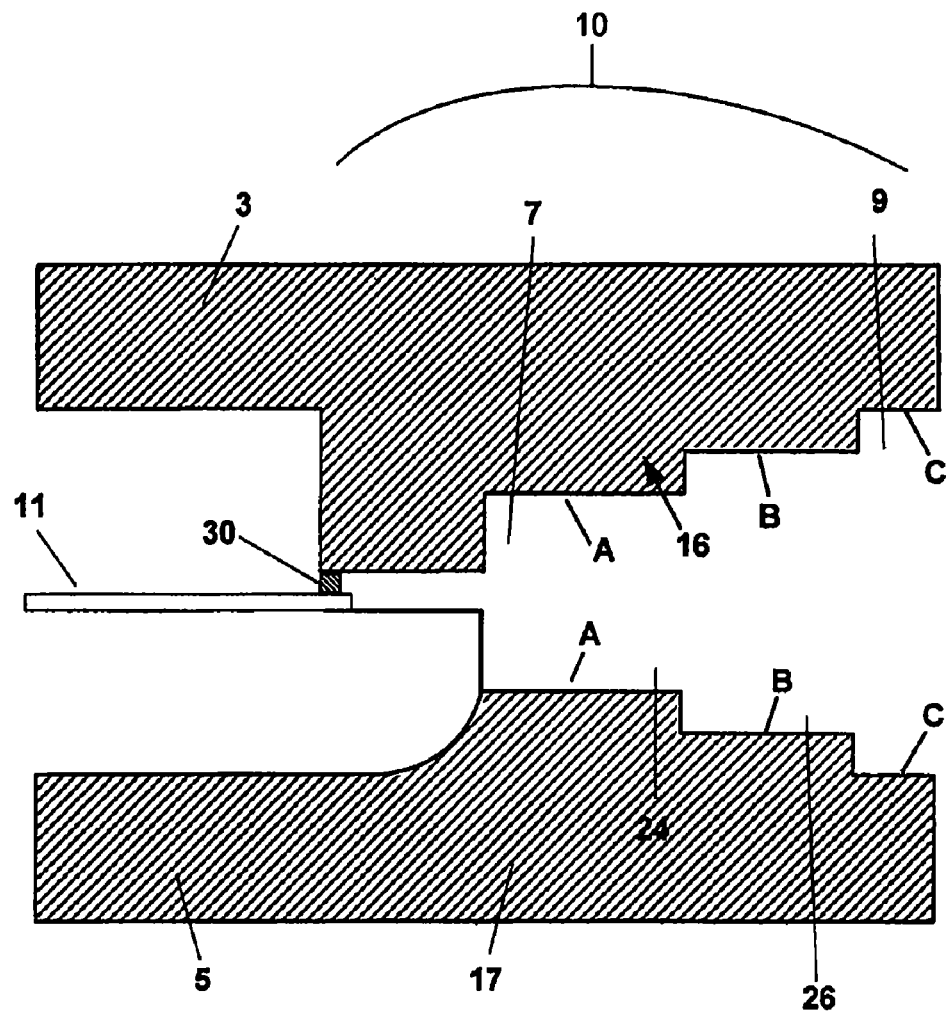
Figure 3C:
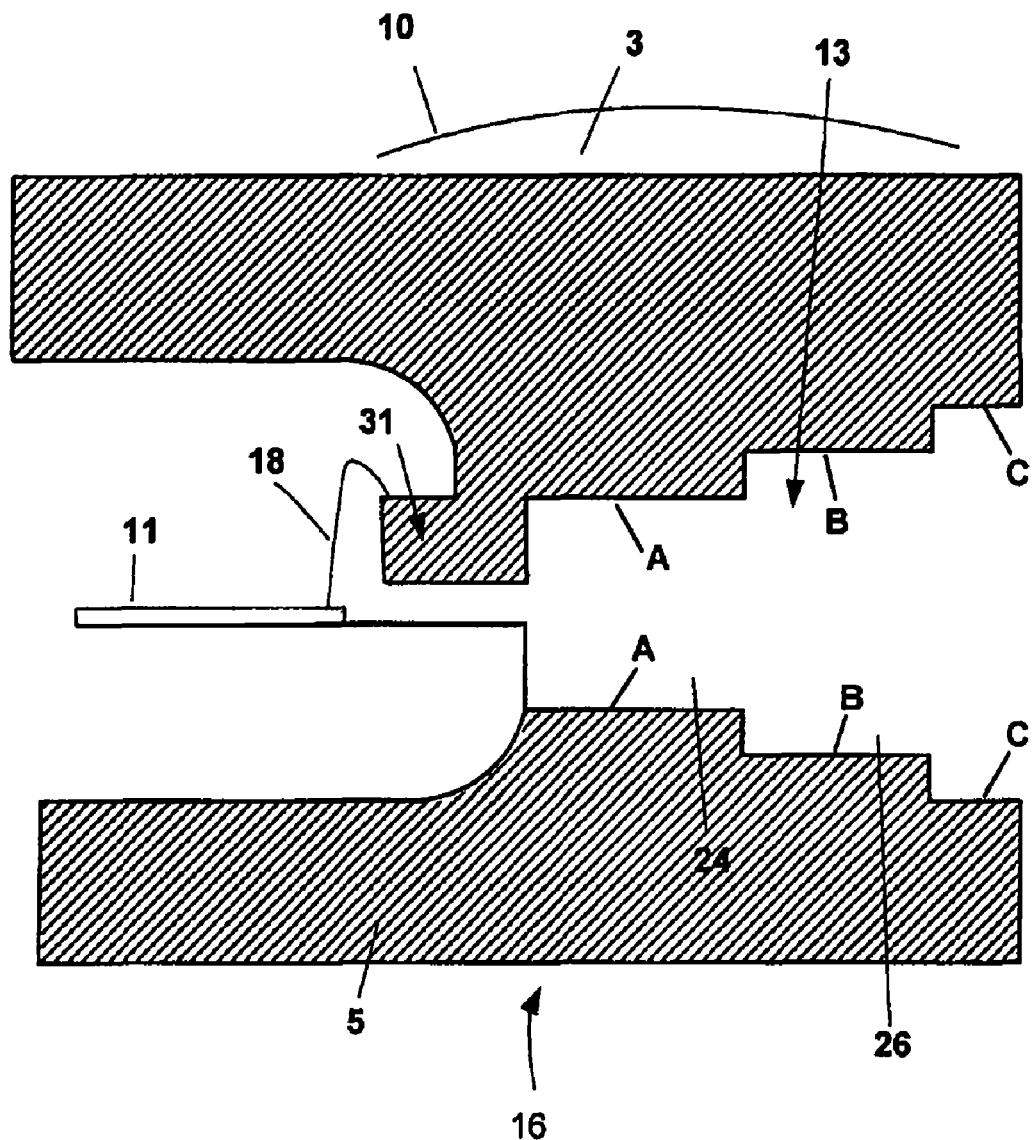
Figure 3D:
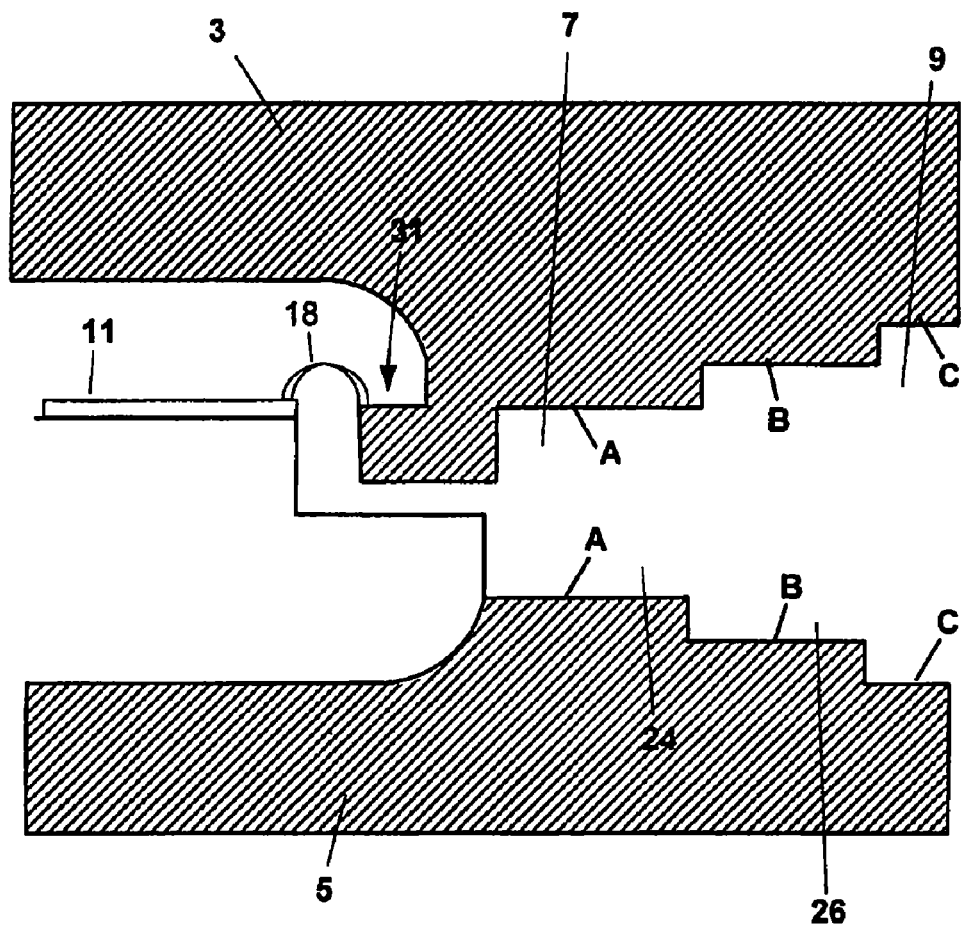

In an exemplary embodiment and with reference now to FIGS. 3C and 3D, step launch 16 is connected to circuit 11 by connection member 18. Connection member 18 can be any type of device that allows energy to pass from step launch 16 to circuit 11. Connection member 18 is flexible and has a certain mechanical give in one exemplary embodiment. In other exemplary embodiments, connection member 18 is rigid or semi-rigid.

With reference to FIGS. 3A-3D and according to exemplary embodiments of the present invention, various different forms of connection members can be used in the present invention. Exemplary connection members have the same impedance as circuit 11 and are configured to have the same mode of energy wave propagation. In one exemplary embodiment, connection member 18 is a wirebond(s) or ribbon bond. In another exemplary embodiment, the connection member is a spongy material 30 that is conductive in the z-axis (the z-axis is perpendicular to MMIC bond pads).

There are numerous ways and various connection points to connect circuit 11 to interface 10. Certain exemplary connections of interface 10 to circuit 11 are shown in FIGS. 3A-3D. With reference to FIG. A, in one exemplary embodiment, the pin 14 is attached to the underside of step launch 16 on one end and contacts circuit 11 on the other end.

In another exemplary embodiment, and with reference to FIG. 3B, spongy material 30 is connected to the underside of step launch 16 on one end and to circuit 11 on the other end of the spongy material. In another exemplary embodiment, and with reference to FIG. 3C, lid 3 may comprise a ledge 31 that sticks out from the lid material and provides a surface for connecting a wire bond 18 to the top of the stub. In this exemplary embodiment stub 31 extends outward from step launch 16 on one end and is connected to circuit 11 via connection member 18.

With reference to FIG. 3D, in yet another exemplary embodiment, interface 10 can be offset from circuit 11. In this exemplary embodiment, the top of stub 31 is in coplanar orientation with respect to circuit 11 and wirebond 18 connects stub 31 to circuit 11. Coplanarity may help reduce loss at microwaves frequencies.

In various exemplary embodiments, interface 10 serves as a pathway for various energy waves, such as RF waves and microwaves. Interface 10 provides impedance and mode transformation to meet the desired impedances and modes of circuit 11 and energy transmission device 13. As energy is passed through interface 10 and into step launch 16, the impedance and mode of wave propagation the energy experiences at step launch 16 changes with first ridge 20 and second ridge 22 (and possibly additional ridges) to eventually match the impedance and mode of energy wave propagation of energy wave propagation the energy would experience at transmission device 13 on the opposing end of interface 10. Although depicted and described herein as a vertical change in the size of the opening, this disclosure also contemplates changing the size of the opening in the horizontal direction. Thus, the size of the cavity in step launch 16 may change from end 7 to end 9 by increasing the height, width, diameter, and/or making any other suitable change to the size of the cavity.

In one example, a MMIC produces microwave energy that experiences a certain first impedance of fifty ohms. This energy experiencing a fifty ohm impedance is produced at the MMIC and is passed into interface 10 through pin 14 and then enters step launch 16. At this point, step launch 16 is configured to handle energy experiencing a fifty ohm impedance with minimal loss. As the microwave energy is traveling through step launch 16, the impedance of step launch 16 gradually changes until it is equal to the impedance of the energy transmission device 13. Therefore, the impedance the energy experiences as it travels through step launch 16 gradually changes until the impedance the energy experiences is equal to that it will experience in energy transmission device 13. As used herein, gradually means changing less abruptly than a direct change from the MMIC impedance to the waveguide impedance in one place.

In this example described, the second impedance is three-hundred and seventy seven ohms. The impedance is changed gradually on interface 10 depending on the number of transition steps or ridges defined by step launch 16 until it reaches three-hundred and seventy seven ohms, the impedance of the energy transmission device 13. Specifically, the impedance may slightly change with each step, A, B, and C as it travels through step launch 16. For example, the impedance might start out at fifty Ohms at step A, change to one hundred and fifty ohms at step B, and finally to three-hundred and seventy seven ohms at step C. Alternatively, the impedance is changed by the slope of step launch 16. Gradually changing the impedance the energy experiences minimizes loss as the energy travels through interface 10.

Besides changing the impedance, the mode of energy wave propagation is also changed as the energy travels through interface 10. For example, a mode of wave propagation for energy transmission device 13 such as a waveguide may be $TE_{10}$ (Transverse Electric, 10) while circuit 11 such as a MMIC may have a microstrip mode of wave propagation of quasi-TEM (Traverse Electromagnetic). Interface 10 will change the mode of wave propagation from circuit 11 to energy transmission device 13 in the same manner it changes the impedance.

Further, interface 10 is capable of matching the impedance of energy transmission device 13 with little or no signal loss. Interface 10 does not require the use of dielectric materials and/or microstrips in one exemplary embodiment. In other exemplary embodiments, some dielectric materials may be used in the manufacture of various components of interface 10.

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles. These and other changes or modifications are intended to be included within the scope of the present invention, as expressed in the following claims.

What is claimed is:

1. An electronic system comprising:
   a monolithic microwave integrated circuit with a first impedance and a first mode of energy wave propagation;
   a second energy transmission device with a second impedance and a second mode of energy wave propagation;
   a step launch interface connecting the monolithic microwave integrated circuit and the second energy transmission device and configured to transport energy from the monolithic microwave integrated circuit to the second energy transmission device with minimal loss by matching the first impedance and first mode of energy wave propagation to the second impedance and second mode of energy wave propagation by performing impedance and mode transition without the use of dielectric material; and
   wherein the system does not include a separate microstrip between the step launch and the monolithic microwave integrated circuit.

2. The electronic system of claim 1, wherein the step launch interface is constructed of an electrically conductive material.

3. The electronic system of claim 1, wherein the second energy transmission device is a waveguide.

4. The electronic system according to claim 3, wherein the monolithic microwave integrated circuit is connected to the step launch interface by a wirebond.

5. The electronic system of claim 3, wherein the monolithic microwave integrated circuit is connected to the step launch interface by a ribbon bond.

6. The electronic system of claim 3, wherein the monolithic microwave integrated circuit is connected to the step launch interface by a spongy material.

7. An electronic system comprising:
   a monolithic microwave integrated circuit;
   a step launch connected to the monolithic microwave integrated circuit on a first end of the step launch, wherein the step launch is configured to match the impedance of the monolithic microwave integrated circuit at the first end; and
   a waveguide connected to a second end of the step launch, the second end of the step launch opposing the first end of the step launch, wherein the second end of the step launch is configured to match the impedance of the waveguide;
   wherein the electronic system does not include a separate microstrip or dielectric material between the step launch and the monolithic microwave integrated circuit.

8. The electronic system of claim 7, further comprising a compressible structure that connects the step launch to the monolithic microwave integrated circuit.

9. The electronic system of claim 7, wherein the step launch comprises a sloped transition.

10. The interface of claim 7, wherein the step launch comprises a cavity in the step launch, wherein the cavity is smaller at the first end than at the second end, and wherein the cavity increases in size from the first end to the second end.

11. The electronic system of claim 7, further comprising a pin that connects the step launch to the monolithic microwave integrated circuit.

12. The electronic system of claim 11, wherein the pin is a spring.

13. The electronic system of claim 7, wherein the step launch comprises a stepped transition.

14. The electronic system of claim 13, wherein the stepped transition comprises a first ridge and a second ridge.

15. An interface comprising:
    a tension absorbing interface pin with a first impedance;
    a monolithic microwave integrated circuit in direct communication with the tension absorbing interface pin without a separate microstrip between the monolithic microwave integrated circuit and tension absorbing interface pin; and
    a waveguide step launch connected to the interface pin and a waveguide, wherein the waveguide step launch comprises a stepped transition and a variable ridge height that enables the waveguide step launch to have at least two impedances, and wherein the impedance at a connection point to the tension absorbing interface pin is equal to the first impedance and the opposing end of the waveguide step launch has a second impedance.

16. (Previously Withdrawn) The interface of claim 15, wherein the tension absorbing interface pin is a spongy, conductive material.

17. The interface of claim 15, wherein the tension absorbing interface pin is wire bonded to the waveguide step launch.

18. The interface of claim 15, wherein the tension absorbing interface pin is attached to an underside of the waveguide step launch.

19. The interface of claim 15, wherein the tension absorbing interface pin is a spring.

20. The interface of claim 15, wherein the second impedance matches the impedance of a waveguide.

21. The interface of claim 20, wherein the waveguide step launch is connected to a waveguide at the opposing end with the second impedance.

22. A pathway for microwaves comprising:
a monolithic microwave integrated circuit with a first impedance;
a wirebond with opposing ends wherein the wirebond is_directly connected to the monolithic microwave integrated circuit on one end and an interface on the opposing end;
the interface having the first impedance at the first end and a second impedance at a second end, the interface further connected to a waveguide at the second end, wherein the waveguide has a second impedance; and
the interface further comprising a cavity, wherein the cavity has a different size at different points along the direction of the microwave pathway, and wherein the size of the cavity increases at different points along the direction of the microwave pathway.

23. The pathway of claim 22, wherein the waveguide step launch comprises a sloped transition.

24. The pathway of claim 22, wherein the interface further comprises a waveguide step launch comprising a stepped transition.

25. The pathway of claim 24, wherein the stepped transition comprises a first ridge and a second ridge.

26. An electronic system comprising:
a monolithic microwave integrated circuit with a first impedance and a first mode of energy wave propagation;
a waveguide with a second impedance and a second mode of energy wave propagation;
a step launch interface connecting the monolithic microwave integrated circuit and the waveguide and configured to transport energy from the monolithic microwave integrated circuit to the waveguide with minimal loss by matching the first impedance and first mode of energy wave propagation to the second impedance and second mode of energy wave propagation by performing impedance and mode transition without the use of dielectric material; and
wherein the system does not include a separate microstrip between the step launch and the monolithic microwave integrated circuit.

27. The electronic system according to claim 26, wherein the monolithic microwave integrated circuit is connected to the step launch interface by a wirebond.

28. The electronic system of claim 26, wherein the monolithic microwave integrated circuit is connected to the step launch interface by a ribbon bond.

* * * * *